(12) United States Patent
Suzuki

(10) Patent No.: US 7,295,284 B2
(45) Date of Patent: Nov. 13, 2007

(54) OPTICAL SYSTEM, EXPOSURE APPARATUS USING THE SAME AND DEVICE MANUFACTURING METHOD

(76) Inventor: Masayuki Suzuki, Canon Kabushiki Kaisha, 3-30-2, Shimomaruko, Ohta-ku, Tokyo (JP)

( * ) Notice: Subject to any disclaimer, the term of this patent is extended or adjusted under 35 U.S.C. 154(b) by 135 days.

(21) Appl. No.: 11/067,072

(22) Filed: Feb. 25, 2005

(65) Prior Publication Data

US 2005/0190347 A1    Sep. 1, 2005

(30) Foreign Application Priority Data

Feb. 27, 2004  (JP) .............................. 2004-053238
Feb. 27, 2004  (JP) .............................. 2004-053239

(51) Int. Cl.
*G03B 27/52* (2006.01)
*G03B 27/42* (2006.01)

(52) U.S. Cl. .......................................... 355/30; 355/53

(58) Field of Classification Search ................ 355/30, 355/53, 67; 359/819–820
See application file for complete search history.

(56) References Cited

U.S. PATENT DOCUMENTS

| 6,359,678 B1 | 3/2002 | Ota |
| 6,747,730 B2 | 6/2004 | Box |
| 2003/0123037 A1 | 7/2003 | Box |
| 2003/0125184 A1 | 7/2003 | Mitra |
| 2004/0165173 A1* | 8/2004 | Box ............................ 355/77 |
| 2005/0110967 A1* | 5/2005 | Hara et al. .................... 355/30 |

FOREIGN PATENT DOCUMENTS

| EP | 1 318 431 | 11/2003 |
| EP | 1 447 717 | 8/2004 |
| JP | 11-243052 A | 9/1999 |
| JP | 2003-188097 A | 7/2003 |
| JP | 2003-267789 A | 9/2003 |
| JP | 2003-303750 A | 10/2003 |
| JP | 2004-80025 A | 3/2004 |
| WO | WO 2004/015477 | 2/2004 |

OTHER PUBLICATIONS

European Patent Office Search Report dated Aug. 4, 2006.

* cited by examiner

*Primary Examiner*—Henry Hung Nguyen

(57) ABSTRACT

An exposure apparatus includes an optical system for guiding light with a central wavelength between 5 and 20 nm from a light source to an object to be exposed, the optical system including a first mirror and a second mirror, a first controller for controlling a temperature of the first mirror to a first zero cross temperature, at which the first mirror has a coefficient of thermal expansion of zero, and a second controller for controlling a temperature of the second mirror to a second zero cross temperature, at which the second mirror has a coefficient of thermal expansion of zero, the second zero cross temperature being different from the first zero cross temperature.

5 Claims, 7 Drawing Sheets

| MIRRORS | FIRST EMBODIMENT | | SECOND EMBODIMENT | | THIRD EMBODIMENT | | FOURTH EMBODIMENT | |
|---|---|---|---|---|---|---|---|---|
| | Tz | Tc | Tz | Tc | Tz | Tc | Tz | Tc |
| M1 | 24.2 | 24.2 | 23.3 | 23.3 | 23.3 | 23.2 | 23.2 | 23.2 |
| M2 | 22.8 | 22.8 | 23.1 | 23.1 | 23.1 | 23.2 | 23.2 | 23.2 |
| M3 | 20.5 | 20.5 | 23.2 | 23.2 | 23.2 | 23.1 | 23.2 | 23.1 |
| M4 | 25.8 | 25.8 | 22.9 | 22.9 | 22.9 | 23.1 | 22.7 | 22.7 |

FIG. 3

OPTICAL SYSTEM, EXPOSURE APPARATUS USING THE SAME AND DEVICE MANUFACTURING METHOD

BACKGROUND OF THE INVENTION

The present invention relates generally to an exposure apparatus that exposes a single crystal substrate for a semiconductor wafer, a glass plate for a liquid crystal display ("LCD"), and more particularly to an exposure apparatus that uses the extreme ultraviolet ("EUV") light for an exposure light source.

A reduction projection exposure apparatus has been conventionally employed which uses a projection optical system to project a circuit pattern formed on a mask (reticle) onto a wafer, etc. to transfer the circuit pattern, in manufacturing such a fine semiconductor device as a semiconductor memory and a logic circuit in photolithography technology.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Along with recent demands for finer processing to the semiconductor devices, a shorter wavelength of ultraviolet ("UV") light has been promoted from a ultra-pressure mercury lamp (i-line) (with a wavelength of approximately 365 nm), a KrF excimer laser (with a wavelength of approximately 248 nm) to an ArF excimer laser (with a wavelength of approximately 193 nm).

However, the lithography using the ultraviolet light has the limit to satisfy the rapidly promoting fine processing to the semiconductor device, and a reduction projection optical system using extreme ultraviolet ("EUV") light with a wavelength of 5 to 20 nm shorter than that of the UV light (referred to as an "EUV exposure apparatus" hereinafter) has been developed to efficiently transfer a very fine circuit pattern of 0.1 µm or less.

The light absorption in a material remarkably increases as the wavelength of the exposure light becomes shorter, and it is difficult to use a refractive element or a lens for the visible light and UV light. In addition, no glass material exists in a wave range of the EUV light, and a catoptric optical system uses only a reflective element, such as a multilayer coating mirror.

The mirror does not reflect all the exposure light, but absorbs the exposure light of 30% or greater. The absorbed exposure light heats and deforms the mirror, and deteriorates its optical performance, in particular, imaging performance. Therefore, the mirror is made of a low thermal expansion material with such a very small coefficient of thermal expansion ("CTE") as 5 ppb/K, so as to reduce a mirror's deformation as the temperature changes.

The EUV exposure apparatus uses a one-tenth wavelength of the conventional UV light, and allows only one-tenth surface deformations of the conventional ones or about 0.1 nm rms or smaller. For example, when the mirror has a CTE of 5 ppb/K and a thickness of 100 mm, the mirror's surface deforms by 0.1 nm, reaching the permissible value of the deformation in the EUV exposure apparatus, as the temperature rises only by 0.2° C.

BRIEF SUMMARY OF THE INVENTION

The present invention is directed to an optical system that has a mirror and can reduce a change of its optical performance even when the temperature of the mirror changes, and an exposure apparatus having the same.

An optical system according to one aspect of the present invention includes a first optical system, a second optical system, a first controller for controlling a temperature of the first optical system to a first temperature, and a second controller for controlling a temperature of the second optical system to a second temperature different from the first temperature.

An optical system according to another aspect of the present invention includes a first optical system, and a second optical system, wherein a first zero cross temperature at which the first optical element has a coefficient of thermal expansion of zero is different from a second zero cross temperature at which the second optical element has a coefficient of thermal expansion of zero, and a difference between the first and second zero cross temperatures is 3° C. or less.

An exposure apparatus according to still another aspect of the present invention includes a stage for supporting an object to be exposed, and the above optical system for directing light from a light source to the object.

An exposure apparatus according to still another aspect of the present invention includes a vacuum chamber for maintaining a vacuum atmosphere in the vacuum chamber, a first optical element, arranged in the vacuum chamber, for directing light from a light source to an object to be exposed, the first optical element having a coefficient of thermal expansion of zero at a first zero cross temperature, a second optical element, arranged in the vacuum chamber, for directing the light to the object to be exposed, the second optical element having a coefficient of thermal expansion of zero at a second zero cross temperature, a first controller for controlling a temperature of the first optical system to a first temperature using radiation, and a second controller for controlling a temperature of the second optical system to a second temperature different from the first temperature using radiation.

An exposure apparatus according to another aspect of the present invention includes a vacuum chamber for maintaining a vacuum atmosphere in the vacuum chamber, a first optical element, arranged in the vacuum chamber, for directing light from a light source to an object to be exposed, the first optical element having a coefficient of thermal expansion of zero at a first zero cross temperature, a second optical element, arranged in the vacuum chamber, for directing the light to the object to be exposed, the second optical element having a coefficient of thermal expansion of zero at a second zero cross temperature, a first controller for controlling a temperature of the first optical system to a first temperature using radiation, and a second controller for controlling a temperature of the second optical system to a second temperature different from the first temperature using radiation, wherein a difference between the first temperature and the first zero cross temperature is 1.5° C. or less, a difference between the second temperature and the second zero cross temperature is 1.5° C. or less, and a difference between the first and second zero cross temperatures is between 0.1° C. and 6° C.

A method according to another aspect of the present invention for manufacturing plural exposure apparatuses, the method includes the steps of classifying plural optical element materials into plural groups according to temperatures of a coefficient of thermal expansion, the optical element materials having the coefficient of thermal expansion of zero at different zero cross temperatures, and manufacturing the optical element of a first exposure apparatus using the optical element material that belongs to a first group among the plural groups.

A device manufacturing method according to another aspect of the present invention includes the steps of exposing an object using the above exposure apparatus, and developing the object exposed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention:

FIG. 3 is a view showing a relationship between the temperature at which each mirror material in the projection optical system in the exposure apparatus shown in FIG. 1 has a CTE of zero and each mirror's control target temperature.

DETAILED DESCRIPTION OF THE PREFERRED EMBODIMENTS

Figure 1:
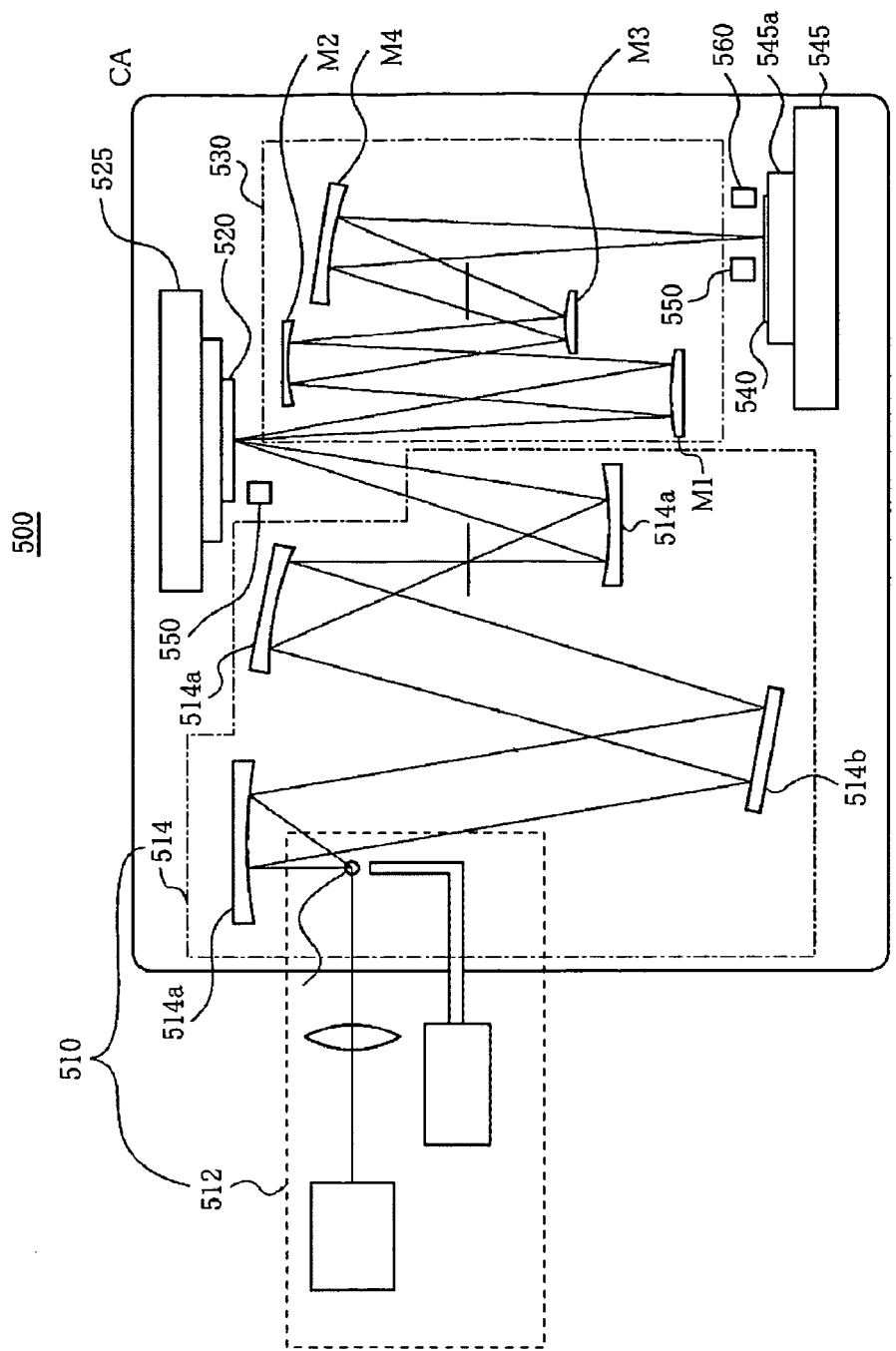
FIG. 1 is a view showing one embodiment of the present invention.

Embodiments of the present invention will now be described in detail in accordance with the accompanying drawings.

A description will now be given of a method for reducing a mirror's deformations relative to temperature changes. An optical element, such as a mirror, deforms as the temperature changes. The deformation amount changes in proportion to a mirror material's CTE. When the CTE is zero, the mirror does not deform even when the temperature varies, but a material that always zeros the CTE has not been found. Some materials, however, zero the CTE at certain temperatures. Accordingly, this embodiment makes a mirror (optical element) of a material that zeros the CTE at or near the actually used temperature. This configuration can reduce the mirror's deformation amount relative to the temperature changes, and resultant deteriorations (or changes) of the optical performance of the optical system that includes the mirror.

It is now assumed that a mirror's material that provides a temperature Tz that zeros the CTE, which temperature is referred to as a "zero cross temperature," satisfies the following Equation where T is temperature (° C.), with respect to the CTE near the temperature Tz:

$$CTE(T)=A(T-Tz)(ppb/K)$$

CTE(T) denotes a coefficient of thermal expansion in a function of the temperature T. "A" denotes an inclination with respect to the temperature T in CTE(T). Tz denotes the temperature at which the mirror's material has a CTE of zero or the zero cross temperature. As apparent from Equation, when the temperature of the above material is controlled around the temperature Tz, the mirror deforms little even as the temperature changes and the optical system that includes the mirror has the stable optical performance irrespective of the temperature changes.

However, in producing the mirror's material, it is very difficult due to manufacture errors to always fix the zero cross temperature, and the zero cross temperature scatters consequently. For example, regardless of an attempt to produce the mirror material so that the zero cross temperature is 23° C., the temperature of the actually manufactured mirror material scatters in a range between about 20 and about 26° C. (e.g., between 22 and 24° C. and between 22.5 and 23.5° C.). As a result, when the entire optical system that includes plural mirrors is controlled at the same temperature, the temperature of the entire optical system is close to the zero cross temperature for some mirrors, but not for others. For the latter mirrors, as the temperature (or heat) changes during exposure, the mirrors' deformation amounts increase and the optical system disadvantageously generates an aberration due to the large CTEs of the mirror materials.

Accordingly, this embodiment has an illustrative object to provide an optical system, and an exposure apparatus having the same, wherein the optical system has plural mirrors made of materials that exhibit CTEs of zero at certain temperatures that scatter among the mirrors due to manufacture errors, but can reduce the deformation amount relative to the temperature changes.

Referring now to the accompanying drawings, a description will be given of the exposure apparatus of this embodiment. Here, FIG. 1 is a schematic structure of an exposure apparatus 500.

The exposure apparatus 500 of this embodiment is a projection exposure apparatus that uses EUV light with a wavelength (having a wavelength of 13.4 nm in this embodiment) as exposure light to expose a circuit pattern of a mask 520 onto an object 540, e.g., in a step-and-repeat or a step-and-scan manner. Such an exposure apparatus is suitably applicable to a submicron or quarter-micron lithography process, and a description will be given below of this embodiment taking a step-and-scan exposure apparatus (which is also called "a scanner") as an example. The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

Referring to FIG. 1, the exposure apparatus 500 includes an illumination apparatus 510, a mask stage 525 that mounts the mask 520, a wafer stage 545 that mounts the object 540, the above projection optical system 530 that forms an image of the mask 520 onto the object 540, an alignment detection mechanism 550, and a focus position detection mechanism 560.

At least an optical path through which EUV light passes or an entire optical system is preferably maintained in a vacuum atmosphere VC due to the low transmittance to the air of the EUV light, as shown in FIG. 1.

The illumination apparatus 510 illuminates the mask 520 using arc-shaped EUV light corresponding to an arc-shaped field of the projection optical system 530, and includes an EUV light source 512 and illumination optical system 514.

The EUV light source 512 employs, for example, a laser plasma light source. It generates high temperature plasma by irradiating a high-intensity pulsed laser beam onto a target material in a vacuum chamber, and uses the EUV light from the plasma. The target material may use a metallic thin film, an inert gas, a liquid-drop, etc., and the target supply unit may use a gas jet and so on. The pulse laser is usually driven with a higher repetitive frequency, such as several kHz, for increased average intensity of radiated EUV light.

The illumination optical system 514 includes a (concave and convex) condenser mirror 514a, and an optical integrator 514b. The condenser mirror 514a serves to collect the EUV light that is isotropically irradiated from the laser plasma. The optical integrator 514b serves to uniformly illuminate the mask 520 with a predetermined NA.

The mask 520 is a reflection mask that has a circuit pattern (or image) to be transferred. The mask 520 is supported and driven by the mask stage 525 via an electrostatic chuck etc., and moves together with the mask stage 525. The diffracted light from the mask 520 is reflected by the projection optical system 530 and projected onto the object 540. The mask 520 and the object 540 are arranged optically conjugate with each other. The exposure apparatus 500 is a step-and-scan exposure apparatus, and projects a reduced size of the pattern of the mask 520 onto the object 540 by scanning the mask 520 and the object 540.

The mask stage 525 supports the mask 520 and is connected to a moving mechanism (not shown). The mask stage 525 may use any structure known in the art. A moving mechanism (not shown) may include a linear motor etc., and drives the mask stage 525 at least in an X direction and moves the mask 520. The exposure apparatus 500 assigns the X direction to scan the mask 520 or the object 540, a Y direction perpendicular to the X direction, and a Z direction perpendicular to the mask 520 or the object 540.

The projection optical system 530 uses plural (multilayer coating) mirrors to project a reduced size of a pattern of the mask 520 onto the object 540. The number of mirrors is about four to six. FIG. 1 illustrates a four-mirror system that includes M1, M2, M3 and M4 in order of reflections from the mask side. For wide exposure area with the small number of mirrors, such as about four to eight (preferably, such an even number as four, six, eight etc.), the mask 520 and object 540 are simultaneously scanned to transfer a wide area that is an arc-shaped area or ring field apart from the optical axis by a predetermined distance. The projection optical system 530 has a NA of about 0.2 to 0.3.

The instant embodiment uses a wafer as the object to be exposed 540, but it may include a spherical semiconductor and liquid crystal plate and a wide range of other objects to be exposed. Photoresist is applied onto the object 540. A photoresist application step includes a pretreatment, an adhesion accelerator application treatment, a photoresist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane) The pre-bake treatment is a baking (or burning) step, softer than that after development, which removes the solvent.

The wafer stage 545 supports the object 540 via a wafer chuck 545a. The wafer stage 545 moves the object 540, for example, using a linear stage in XYZ directions. The wafer stage mounted with the object 540 is synchronously scanned with the above mask stage 525 while the projection magnification of the projection optical system 530 is considered. The positions of the mask stage 525 and wafer stage 545 are monitored, for example, by a laser interferometer, and driven at a constant speed ratio.

The alignment detection mechanism 550 measures a positional relationship between the position of the mask 520 and the optical axis of the projection optical system 530, and a positional relationship between the position of the object 540 and the optical axis of the projection optical system 530. The alignment detection mechanism 550 sets positions and angles of the mask stage 525 and the wafer stage 545 so that a projected image of the mask 520 may be positioned in place on the object 540.

The focus detection optical system 560 measures a focus position in the direction Z on the object 540 surface, and controls a position and angle of the wafer stage 545, always maintaining the object 540 surface at an imaging position of the projection optical system 530 during exposure.

In exposure, the EUV light emitted from the illumination apparatus 510 illuminates the mask 520, and images a pattern of the mask 520 onto the object 540 surface. The instant embodiment uses an arc or ring shaped image plane, scans the mask 520 and object 540 at a speed ratio corresponding to a reduction ratio to expose the entire surface of the mask 520.

Figure 2:
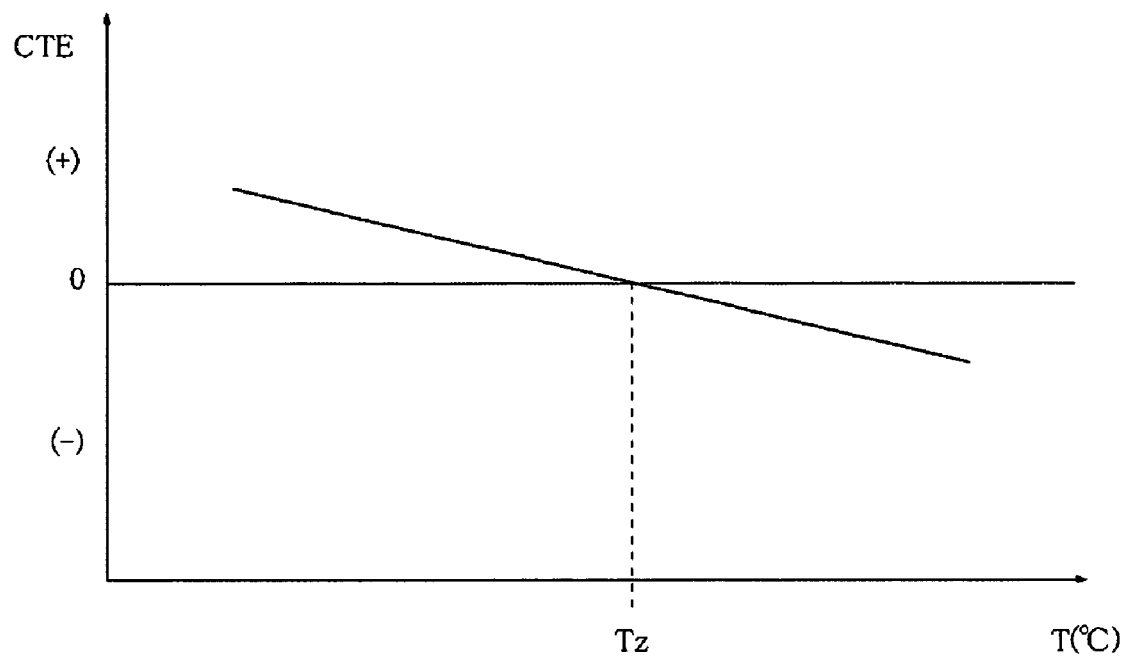
FIG. 2 is a view showing a temperature dependency of the mirror material's CTE.

Referring now to FIGS. 2 and 3, a description will be given of the CTE characteristic of each mirror in the projection optical system 530 in FIG. 1 and the temperature of each mirror.

FIG. 2 is a graph showing the illustrative CTE temperature dependency of the mirror material, where the abscissa axis denotes the temperature T (° C.), and the ordinate axis denotes the CTE. At the temperature Tz (° C.), the mirror material used for this embodiment has the CTE of zero.

The CTE changes approximately linearly near the temperature of Tz (° C.). For example, at Tz=23° C., an inclination A is −1.25 [ppb/K/K], and CTE is approximated to −1.25×(T−23.0) [ppb/K]. The deformation due to the temperature (or heat) changes is reduced by controlling the mirror's temperature around 23.0° C.

As the mirror's temperature shifts from Tz, the CTE gradually increases, and the mirror's deformation amount and the aberration increase due to the unit temperature (heat) changes.

As discussed above, it is very difficult due to manufacture errors to equalize all the CTEs among the plural mirrors, and values of the zero cross temperatures Tz differ from one another and scatter among mirrors.

Accordingly, this embodiment controls temperatures of plural mirrors having different zero cross temperatures so that each mirror has the most preferable temperature, and maintains the optical performance of the optical system including these mirrors. The mirror's temperature, which is the control target temperature is preferably controlled to the zero cross temperature of each mirror material, but may offset from the zero cross temperature within a range of 1.5° C. (more preferably 1.0° C., most preferably 0.5° C.).

FIG. 3 shows a specific numerical example that indicates the temperatures Tz that zero the CTEs of mirrors M1 to M4 and the mirror's target temperature Tc to be controlled for the mirrors M1 to M4 in the first to fourth embodiments. As shown in FIG. 3, the most preferable, temperature target value is set for each mirror, and a temperature control mechanism, which will be described later, cools (and/or heats) each mirror for temperature control.

This embodiment allows the control target temperatures to be different between two mirrors among the plural (or four in this embodiment) mirrors. More specifically, it is conceivable that mirror materials have different zero cross temperatures, as shown in the first to third embodiments in FIG. 3. In this case, different control target temperatures are set for respective mirrors for temperature control. In the fourth embodiment, M1 and M2 have the same zero cross temperature, and thus are temperature-controlled at the zero cross temperature.

As discussed above, in controlling the temperatures of plural mirrors (e.g., two pairs of mirrors each pair having different zero cross temperatures in this embodiment) in the optical system, such as the projection optical system and/or the illumination optical system in the exposure apparatus, this embodiment reduces the deformation amount to the mirror's temperature changes by controlling each mirror's (control target) temperature to the zero cross temperature Tz.

The mirrors' temperatures may be controlled so that each mirror's (control target) temperature differs from the zero cross temperature Tz, if the aberration amount of the entire optical system that includes these mirrors deteriorates by according each mirror's (control target) temperature with the zero cross temperature Tz, for example, where the wave front measurement result of the optical system is very bad or where a certain aberration is great in the optical system. However, it is preferable to maintain the offset between the mirror's temperature and the zero cross temperature Tz within a range of 1.5° C. (more preferably 1.0° C., most preferably 0.5° C.).

When the optical system including this mirror to an optical system that has such a high light absorption index as 5% or greater, preferably 10% or greater, or 25% or greater, at each mirror, like an illumination optical system and a projection optical system in the EUV exposure apparatus, the temperature of the optical system can be determined as follows: When the optical system has such a high light absorption index, a mirror closer to the light source on the optical path (or a mask in case of the projection optical system) has a larger light absorption amount and is likely to deform due to the temperature changes. The temperature of the mirror closer to the light source is set close to the zero cross temperature. On the contrary, a mirror closer to the object to be exposed, such as a wafer and another substrate, has a smaller light absorption amount and is unlikely to deform due to the temperature changes, and the deformation amount, if any, is very small. Therefore, the control target temperature of the mirror may offset from the zero cross temperature. More specifically, the control target temperatures may be set so as to maintain the specific aberrations (such as the wave front aberration, the distortion and the astigmatism) of the optical system in a preferred range such that an offset of the temperature of the mirror that is the closest to the light source is within 1.5° C., more preferably within 1.0° C., and most preferably within 0.5° C. from the zero cross temperature, and an offset of the temperature of the mirror that is the closest to the object to be exposed is within 2.0° C. or 3.0° C. from the zero cross temperature.

As discussed, while it is preferable to set the control target temperature for each mirror around the zero cross temperature, the control becomes difficult if the control target temperatures among mirrors are remarkably different. Thus, it is preferable that a difference between the highest control target temperature and the lowest control target temperature among mirrors is maintained within 6° C., more preferably within 3.0° C., and most preferably within 1.5° C.

In addition, the difference between the highest control target temperature and the lowest control target temperature among mirrors is (Tdif−0.1) or greater and/or 0.1° C. or greater (more preferably 0.4° C. or greater), where Tdiff is a difference between the highest and lowest zero cross temperatures.

The aberrational variance amount to the temperature changes can reduce in the optical system that includes these mirrors by controlling the temperature of each mirror in the above manner. When plural mirrors in the optical system have different zero cross temperatures (and the difference between the highest and lowest zero cross temperatures is 0.1° C. or greater, more preferably 0.3° C. or greater, most preferably 1.0° C. or greater), the temperature control using the different control target temperatures for these plural mirrors can effectively reduce the expansions of each mirror due to the temperature changes, thermal deformations due to the exposure, and the aberrational amount of the optical system caused by the thermal deformations.

Of course, it is unnecessary to set different control target temperatures for all the mirrors. When a zero cross temperature of a first mirror is different from a zero cross temperature of a second mirror among plural mirrors in the optical system, the control target temperatures of the first and second mirrors may be set differently. In this case, the third mirror's control target temperature and/or the fourth mirror's control target temperature may be equal to the first mirror's control target temperature. Even when two mirrors have the same temperature that zeros the CTE, as in M2 and M3 in the fourth embodiment, the different control target temperatures may be set. The control target temperature may be set equally even for two mirrors having different zero cross temperatures, as in M1 and M2 in the third embodiment.

Figure 7:
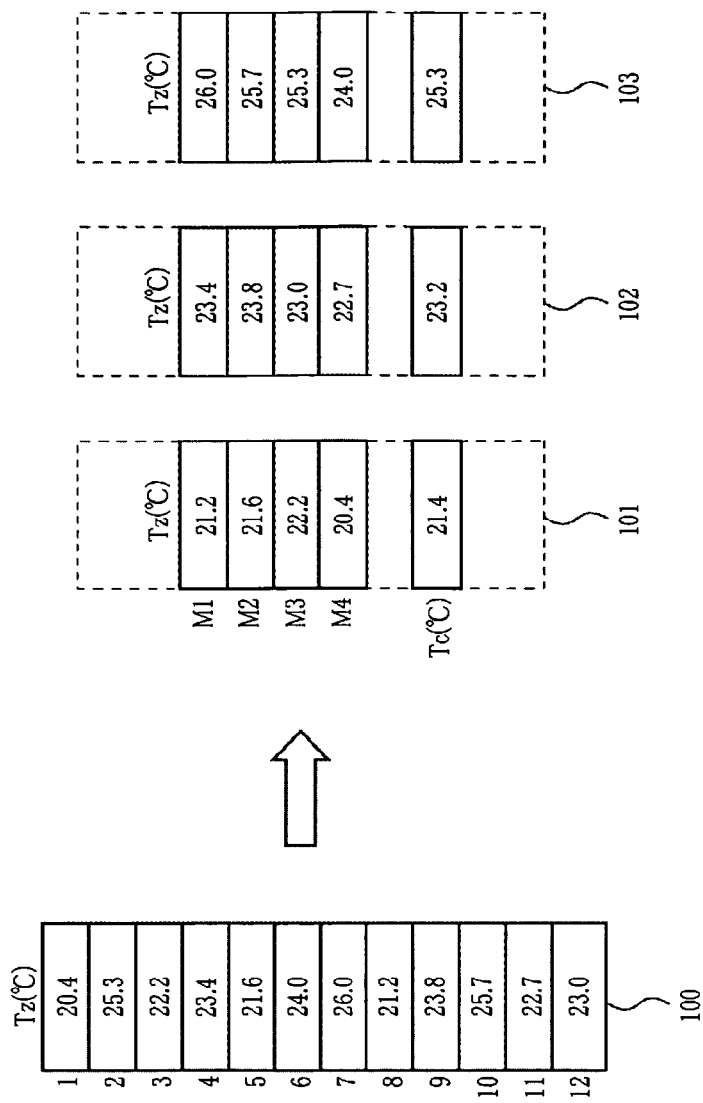
FIG. 7 is a view showing a relationship between the temperature at which each mirror material in the projection optical system in the exposure apparatus shown in FIG. 1 has a CTE of zero and each mirror's control target temperature.

FIG. 7 is a view showing the zero cross temperatures Tz that zero the CTEs of the mirrors in this embodiment, and the control target temperatures Tc used for temperature control of these mirrors. This fifth embodiment attempts to manufacture three four-mirror projection optical systems from twelve mirror materials. In FIG. 7, 100 denotes Tz values of twelve mirror materials. Tz values of the twelve mirror materials scatter within a range of 6° C. 101, 102 and 103 denote three groups having similar Tz values selected from among the twelve mirror materials, and these Tz values correspond to mirror materials used for projection optical systems in first, second and third exposure apparatuses, respectively. M1 to M4 denote first to fourth mirrors, respectively, and Tc is a mirror's control target temperature in each exposure apparatus.

Figure 6:
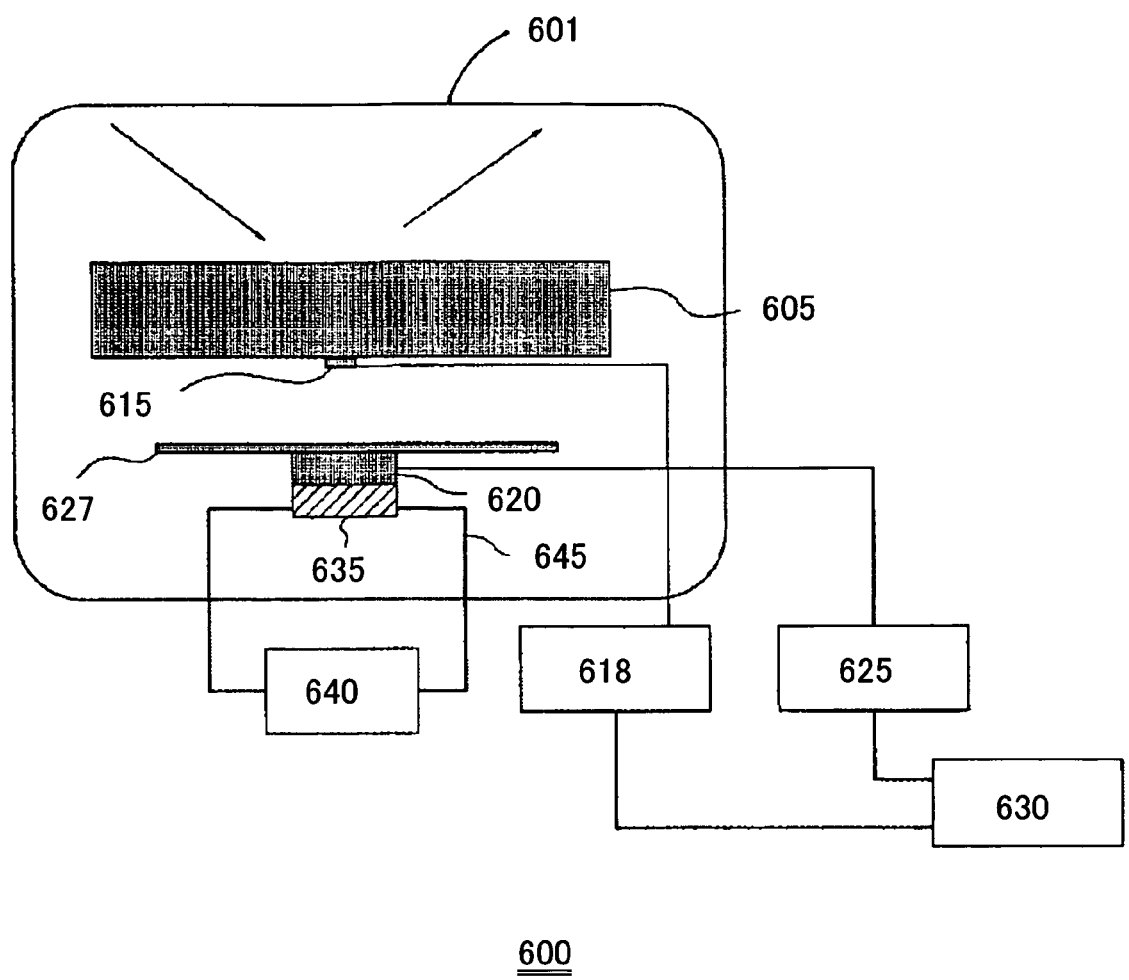
FIG. 6 is a view showing another embodiment of a radiation cooling mechanism.

The classification of twelve mirror materials having Tz that scatter in a range of 6° C. into three groups can maintain Tz in each group to scatter within a range of 2° C. Each of the three projection optical systems of the three groups uses a mirror material having an almost equal Tz (which scatters within a range of 2° C.). Therefore, the temperatures of the mirrors M1 to M4 can be controlled constant. FIG. 6 assumes that all the mirrors M1 to M4 are controlled at the same control target temperature for each exposure apparatus, and the control target temperature uses an average value of the zero cross temperatures Tz of four mirrors M1 to M4. As a result, in the embodiment shown in FIG. 6, the mirror's temperature of the projection optical system in the first exposure apparatus is controlled to 21.4° C., that in the second exposure apparatus is controlled to 23.2° C., and that in the third exposure apparatus is controlled to 25.3° C.

The Tz values among the groups have different average values, and a difference of the average values among these groups is preferably 0.5° C. or greater (more preferably 1.0° C. or greater, and most preferably 1.5° C. or greater).

However, the control target temperature may use another value. For example, the Tc value when set to a M1's Tz value can reduce a deformation amount of M1 that receives the largest light dose and is likely to deform most significantly among M1 to M4. The Tc value when set to a value between the M1's Tz value and a M2's Tz value can reduce deformation amounts of M1 and M2 that receive the large light dose and are likely to deform similarly.

For smaller deformations during exposure, the control target temperature of each of the mirrors M1 to M4 may be set to a Tz value of each mirror. The control target temperatures are then different from each other among these mirrors, but the proper temperature control over each mirror's temperature is available as long as a difference between the highest value and the lowest value of the zero cross temperatures among mirrors is maintained within 3° C., more preferably within 2° C., and most preferably within 1° C. On the contrary, when the difference between the highest and lowest zero cross temperatures among mirrors exceeds 3° C., each mirror may not be properly temperature-controlled.

For this configuration, a difference between the highest and lowest zero cross temperatures among mirrors in the optical system in the exposure apparatus is preferably within 3° C., more preferably within 2° C., and most preferably within 1° C.

This embodiment exemplarily recites twelve mirror materials, but as the number increases, scattering of the zero cross temperature of the mirror material for each exposure apparatus can be maintained within a range of 1° C. or even within a range of 0.5° C. On the contrary, as the number decrease, the zero cross temperature of the mirror material for each exposure apparatus may scatter within a range of about 3° C., but scattering within 3° C. can maintain proper temperature control of each mirror. However, if, as the number decrease, the zero cross temperature of the mirror material for each exposure apparatus scatters beyond a range of about 3° C., each mirror may not possibly be properly temperature-controlled. Therefore, the control target temperature of one (or two) mirrors may be offset from the zero cross temperature.

A brief description will be given of the above temperature control mechanism. The temperature control mechanism can use a cooling mechanism 600 shown in FIG. 6, but may use another known temperature control mechanism. The cooling mechanism 600 includes an optical element 605 (or a mirror in FIG. 6) in a space enclosed by the vacuum chamber 610 (a vacuum atmosphere), and the EUV light 610 as the exposure light is irradiated onto the front surface side of the optical element 605. The mechanism further includes a temperature detector 618 that detects the temperature of the optical element 605 using the temperature sensor 615, and a (mirror) temperature controller 630 that sends an instruction to a Peltier device controller 625 that controls a Peltier device 620. A radiation plate 627 that controls the temperature of the optical element 605 through radiations is provided at one side of the Peltier element 620, opposite to the above optical element (or mirror) 605. A cooling jacket 635 is provided at the other side of the Peltier element 620. The cooling jacket 635 is controlled at an approximately constant temperature by the heat medium flowed from a heat medium circulator 640 via a heat medium pipe 645. In this configuration, controls over the temperature of the cooling jacket and driving of the above Peltier device control the temperature of the radiation plate 627 and ultimately control (or cool) the temperature of the optical element (or mirror).

The temperature sensor is provided at the mirror's backside, and detects the temperature of the mirror's backside, rather than the temperature of the mirror's front side. Of course, the temperature sensor may detect the temperature of the mirror's back surface, side surface and/or front surface. The provided temperature sensor can detect the temperature of the non-irradiated region of the exposure light or the mirror's front surface in a non-contact manner. The mirror's temperature distribution is operated based on the detection result, and the control target temperature may be determined based on the temperature distribution. Alternatively, the control target temperature may be determined based on a correlation between outputs of the predetermined temperature sensor and the control target temperatures (and the temperature distributions, if necessary). Thus, the mirror's control target temperature is determined, and the mirror's temperature is controlled using the radiator (or radiation plate) so that the mirror has the desired temperature.

Here, the control target temperature Tc is a control target value of the mirror's temperature. The "mirror's (or optical element's) temperature" is an average temperature of the entire mirror or an average temperature of the mirror's irradiated region in a thickness direction, or an average temperature of a mirror's predetermined region or point in a thickness direction. However, the control target temperature is not limited to these temperatures, and may be a mirror's front surface temperature, a mirror's back surface temperature, a temperature at a point measured by a temperature sensor, or a numerical value calculated based on plural detected values from plural temperature sensors. Nevertheless, in order to reduce the deformation amount associated with the mirror's temperature changes, the control target temperature Tc is preferably the average temperature of the entire mirror or the average temperature of the mirror's irradiated region in the thickness direction.

In the above embodiment, each mirror's control target temperature is substantially equivalent to the actual temperature of the optical element (or mirror), and the control target temperature of the optical element and the (actual) temperature of the optical element may be interchangeably used and interpreted unless a contradiction occurs.

Figure 4:
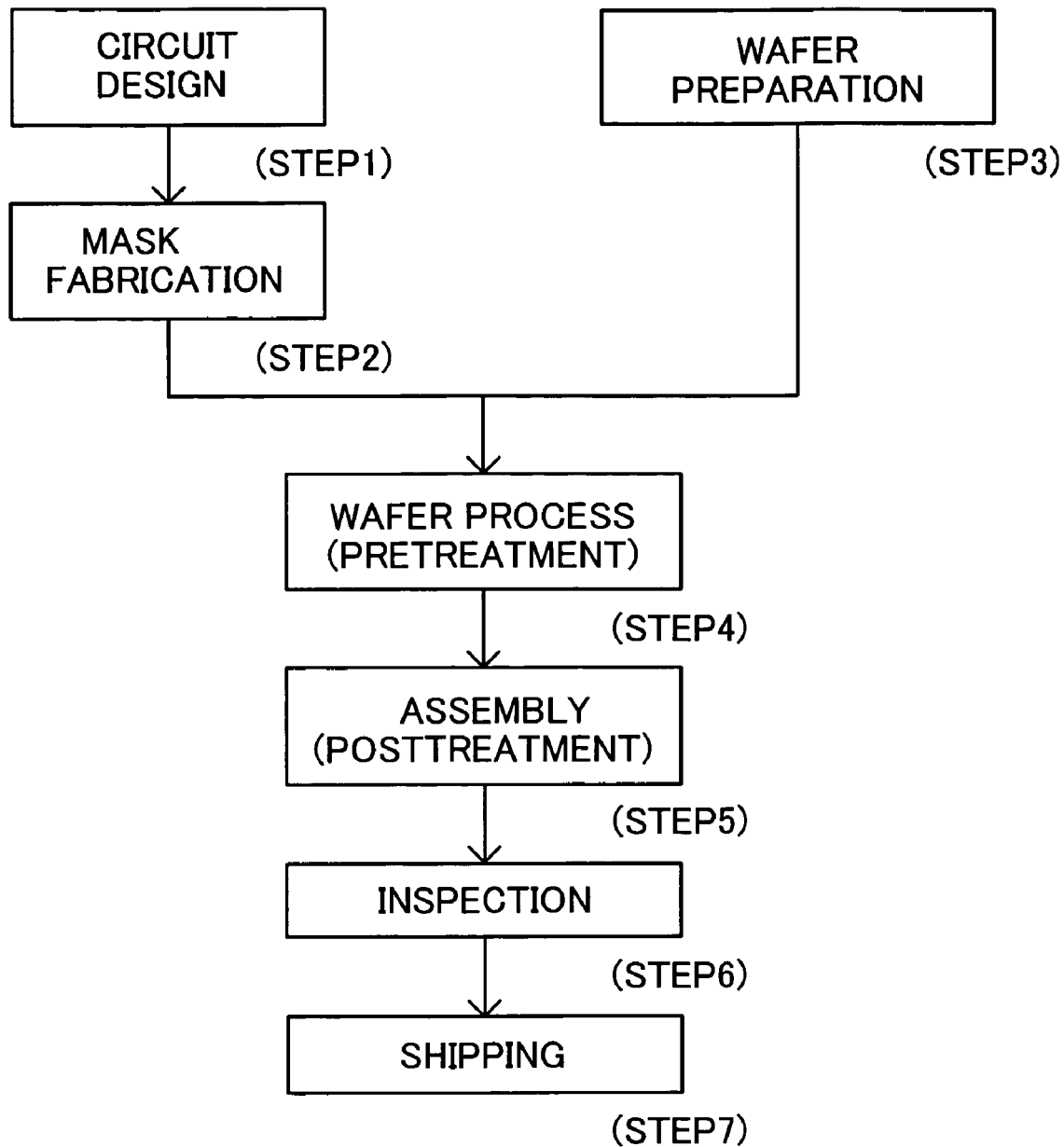
FIG. 4 is a flowchart for explaining a method for fabricating devices (semiconductor chips such as ICs, LSIs, and the like, LCDs, CCDs, etc.).
Figure 5:
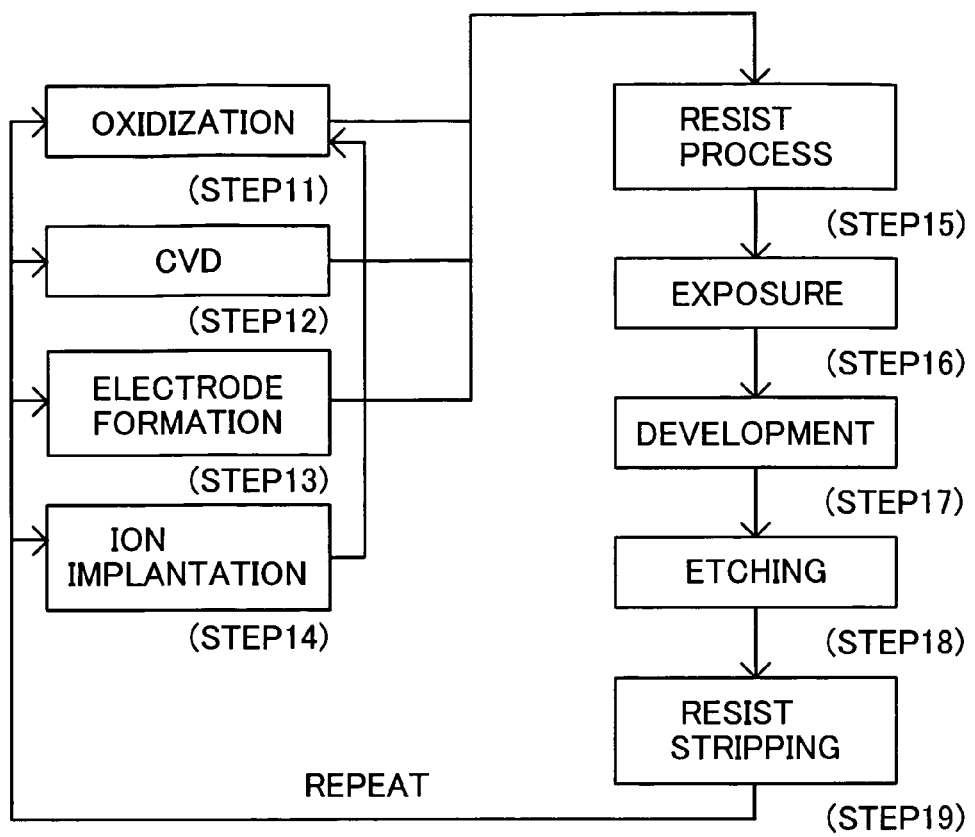
FIG. 5 is a detailed flowchart for Step 4 of wafer process shown in FIG. 4.

Referring now to FIGS. 4 and 5, a description will now be given of an embodiment of a device manufacturing method sing the above exposure apparatus. FIG. 4 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the above exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The manufacturing method of the present embodiment can manufacture semiconductor devices which have been difficult to manufacture. Thus, the device manufacturing method that uses the exposure apparatus, and its resultant (intermediate and final) products also constitute one aspect of the present invention.

Further, the present invention is not limited to these preferred embodiments, and various modifications and changes may be made in the present invention without departing from the spirit and scope thereof. For example, the present invention is applicable to an exposure apparatus that includes a mirror for use with the light other than the EUV light, such as g-line, h-line, i-line, an ArF excimer laser, and an $F_2$ laser. The present invention is applicable to a mask and an illumination optical system in addition to an imaging mirror in the projection optical system.

The entire disclosure of Japanese Patent Applications Nos. 2004-053238 and 2004-053239 filed on Feb. 27, 2004 including claims, specification, drawings, and abstract are incorporated herein by reference in its entirety.

As many apparently widely different embodiments of the present invention can be made without departing from the sprit and scope thereof, it is to be understood that the invention is not limited to the specific embodiments thereof except as defined in the claims.

What is claimed is:

1. An exposure apparatus comprising:

an optical system for guiding light with a central wavelength between from 5 and 20 nm from a light source to an object to be exposed, the optical system including a first mirror and a second mirror;

a first controller for controlling a temperature of the first mirror to a first zero cross temperature, at which the first mirror has a coefficient of thermal expansion of zero; and a second controller for controlling a temperature of the second mirror to a second zero cross temperature, at which the second mirror has a coefficient of thermal expansion of zero, the second zero cross temperature being different from the first zero cross temperature.

2. An exposure apparatus according to claim 1, wherein a difference between the first and second zero cross temperatures is 2° C. or less.

3. An exposure apparatus according to claim 1, wherein a difference between the first and second zero cross temperatures is 1° C. or less.

4. An exposure apparatus according to claim 1:

the first controller controls the temperature of said first mirror using radiation and the second controller controls the temperature of said second mirror using radiation.

5. A device manufacturing method comprising the steps of:

exposing an object to be exposed using an exposure apparatus according to claim 1, developing the object exposed.

* * * * *

UNITED STATES PATENT AND TRADEMARK OFFICE
CERTIFICATE OF CORRECTION

PATENT NO.        : 7,295,284 B2                                        Page 1 of 1
APPLICATION NO.   : 11/067072
DATED             : November 13, 2007
INVENTOR(S)       : Suzuki It is certified that error appears in the above-identified patent and that said Letters Patent is hereby corrected as shown below:

On the Title Page:

under "(76) Inventor:" change "Canon Kabushiki Kaisha, 3-30-2, Shimomaruko, Ohta-ku, Tokyo (JP)" to --Tochigi (JP)--; and after "(*) Notice", add --(73) Assignee: Canon Kabushiki Kaisha, Tokyo (JP)--.

Signed and Sealed this

Nineteenth Day of August, 2008

JON W. DUDAS
*Director of the United States Patent and Trademark Office*